(12) United States Patent
Ok et al.

(10) Patent No.: US 9,269,620 B2
(45) Date of Patent: Feb. 23, 2016

(54) METHOD OF MANUFACTURING BUMP

(71) Applicant: Samsung Electronics Co., Ltd., Suwon-si (KR)

(72) Inventors: Jung Tae Ok, Suwon-si (KR); Hak Hwan Kim, Suwon-si (KR); Ho Sun Paek, Suwon-si (KR); Kwon Joong Kim, Osan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 526 days.

(21) Appl. No.: 13/710,586

(22) Filed: Dec. 11, 2012

(65) Prior Publication Data
US 2013/0149858 A1 Jun. 13, 2013

(30) Foreign Application Priority Data
Dec. 12, 2011 (KR) .................. 10-2011-0132956

(51) Int. Cl.
- *H01L 23/498* (2006.01)
- *H01L 21/768* (2006.01)
- *H01L 23/48* (2006.01)
- *H01L 23/485* (2006.01)
- *H01L 23/00* (2006.01)

(52) U.S. Cl.
CPC .......... *H01L 21/76892* (2013.01); *H01L 24/05* (2013.01); *H01L 24/11* (2013.01); *H01L 24/13* (2013.01); *H01L 2224/0401* (2013.01); *H01L 2224/05023* (2013.01); *H01L 2224/05171* (2013.01); *H01L 2224/05568* (2013.01); *H01L 2224/05639* (2013.01); *H01L 2224/05644* (2013.01); *H01L 2224/05664* (2013.01); *H01L 2224/05669* (2013.01); *H01L 2224/1132* (2013.01); *H01L 2224/11849* (2013.01); *H01L 2224/13006* (2013.01); *H01L 2224/13007* (2013.01); *H01L 2224/13012* (2013.01); *H01L 2224/13016* (2013.01); *H01L 2224/13111* (2013.01); *H01L 2224/13139* (2013.01); *H01L 2224/13147* (2013.01); *H01L 2924/00014* (2013.01)

(58) Field of Classification Search
CPC ... H01L 21/76892; H01L 24/11; H01L 24/05; H01L 24/13
USPC .......... 438/613, 614, 107, 109; 257/737, 774, 257/777
See application file for complete search history.

(56) References Cited

U.S. PATENT DOCUMENTS

| | | | | |
|---|---|---|---|---|
| 6,027,957 A | * | 2/2000 | Merritt | H01L 23/4827 257/E23.017 |
| 6,100,175 A | * | 8/2000 | Wood | H01L 21/4853 228/180.1 |

(Continued)

FOREIGN PATENT DOCUMENTS

| | | |
|---|---|---|
| JP | 07-176855 | 7/1995 |
| JP | 08-288630 | 11/1996 |
| KR | 10-2000-0025690 A | 5/2000 |

*Primary Examiner* — Long K Tran
*Assistant Examiner* — Thai T Vuong
(74) *Attorney, Agent, or Firm* — Muir Patent Law, PLLC (57) ABSTRACT

A bump manufacturing method may be provided. The bump manufacturing method may include forming a bump on an electrode pad included in a semiconductor device, and controlling a shape of the bump by reflowing the bump formed on the semiconductor device under an oxygen atmosphere.

20 Claims, 6 Drawing Sheets

(56) References Cited

U.S. PATENT DOCUMENTS

| | | | | |
|---|---|---|---|---|
| 6,319,810 B1* | 11/2001 | Ochiai et al. | | 438/616 |
| 7,955,966 B2* | 6/2011 | Gruber | | H01L 24/11 438/613 |
| 8,012,866 B2* | 9/2011 | Tu | | B23K 1/0016 257/E21.088 |
| 8,043,956 B2* | 10/2011 | Lehr | | H01L 24/05 438/614 |
| 8,048,794 B2* | 11/2011 | Knickerbocker | | H01L 21/76898 257/774 |
| 8,058,138 B2* | 11/2011 | McGinnis | | H01L 21/02164 257/E21.463 |
| 2002/0056910 A1* | 5/2002 | Howell et al. | | 257/737 |
| 2002/0090804 A1* | 7/2002 | McTeer | | H01L 21/76849 438/612 |
| 2002/0192939 A1* | 12/2002 | Sugihara | | F28F 9/001 438/629 |
| 2003/0019917 A1* | 1/2003 | Furuno | | B23K 1/206 228/246 |
| 2006/0033189 A1* | 2/2006 | Haba | | B81B 7/007 257/678 |
| 2008/0128476 A1* | 6/2008 | Wang et al. | | 228/256 |
| 2009/0149016 A1* | 6/2009 | Park | | H01L 24/11 438/614 |
| 2011/0006409 A1* | 1/2011 | Gruenhagen | | H01L 24/05 257/666 |
| 2012/0098126 A1* | 4/2012 | Iwasaki et al. | | 257/737 |

* cited by examiner

METHOD OF MANUFACTURING BUMP

CROSS-REFERENCE TO RELATED APPLICATIONS

This application claims the benefit of Korean Patent Application No. 10-2011-0132956, filed on Dec. 12, 2011, in the Korean Intellectual Property Office, the disclosure of which is incorporated herein by reference in its entirety.

BACKGROUND

The present disclosure relates to a bump manufacturing method, and more particularly, to a bump manufacturing method that provides varied shapes of bumps by adjusting a reflow condition.

Semiconductor devices, particularly semiconductor light emitting devices, may be manufactured as packages or modules. Recently, semiconductor devices are being manufactured more frequently as modules for a chip on board (COB) scheme that contains a module directly on a board, as opposed to being manufactured as packages. Accordingly, semiconductor device modules manufactured for the COB scheme may reduce costs for manufacturing the packages, and may improve heat radiation by reducing a heat transfer path.

A technology has been developed that manufactures the semiconductor device modules as flip chip on module (FCOM) that contains a semiconductor device on a module board in a form of a flip chip. Accordingly, when semiconductor device modules are manufactured for the COB scheme, the semiconductor device modules may be manufactured as FCOM and thus, wire-bonding may not be used to provide an electrical connection between the semiconductor device and the module board. The FCOM may include a semiconductor device based on a flip chip scheme and thus, the semiconductor device may be densely mounted on the module board, and a size of the module may be reduced.

To embody the FCOM, a process that forms a bump on an electrode pad included in the semiconductor device may be used. The bump forming process may be performed, for example, based on a plating scheme or a screen-printing scheme.

The plating scheme may form bumps at fine pitches, and may manufacture varied sizes of bumps. However, as manufacturing costs are high, a price competitiveness of the semiconductor device module may be adversely affected.

Conversely, although the screen-printing scheme has a simple manufacturing process and relatively lower manufacturing costs, the screen-printing scheme may have difficulty in providing fine pitches among the bumps. However, the screen-printing scheme may be appropriate for a light emitting device that does not need the fine pitches among bumps. When bumps are formed based on the screen-printing scheme, a semiconductor device on which the bumps are formed may be reflowed.

Figure 1:
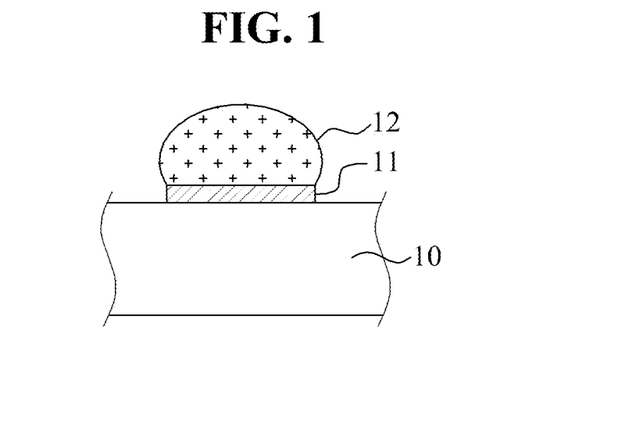
FIG. 1 is a diagram illustrating a conventional shape of a bump that is reflowed through a reflow process.

FIG. 1 illustrates a conventional shape of a bump 12 that is reflowed through a reflow process.

Referring to FIG. 1, the bump 12 may be spread over a whole electrode pad 11 included in a semiconductor device 10, through a reflow process, and a surface of the bump becomes curved as a surface energy decreases. For example, a shape of a bonded surface of the bump 12 may be determined based on the electrode pad 11, and the bump 12 may have a convex surface.

A shape of the bump 12 may vary based on a product to which the semiconductor device 10 is to be applied. To change the shape of the bump 12 of FIG. 1 to a globular shape, the electrode 11 may be manufactured in a circular shape. However, in this instance, it is still difficult to manufacture the bump 12 in a complete globular shape.

Therefore, to change the shape of the bump 12 to a globular shape, an additional process or device for modifying the shape of the bump 12 during the reflow process may be needed.

SUMMARY

An aspect of the present disclosure provides a bump manufacturing method that changes a shape of a bump by reflowing the bump under an oxygen atmosphere.

According to one embodiment, there is provided a bump manufacturing method, the method including forming a bump on an electrode pad included on a semiconductor chip, and controlling a shape of the bump by reflowing the bump formed on the semiconductor chip under an oxygen atmosphere.

The electrode pad may include a first electrode layer formed of chromium (Cr) and formed on the semiconductor chip, and a second electrode layer formed of at least one of gold (Au), silver (Ag), platinum (Pt), and palladium (Pd), and formed on the first electrode layer.

The bump may correspond to a solder bump.

The controlling may include controlling a degree of absorption by which a metallic layer is absorbed in the bump, by adjusting an amount of oxygen concentration.

The controlling may include controlling the shape of the bump to be one of a planar shape or a globular shape, by reflowing the bump under an oxygen atmosphere, the oxygen atmosphere corresponding to one of a first range of oxygen concentration and a second range of oxygen concentration which is lower than the first range of oxygen concentration.

The controlling may include controlling the shape of the bump to have a semi-globular shape on the electrode pad, by reflowing the bump under a third range of oxygen atmosphere, which is lower than a first range of oxygen concentration used to form bumps having planar shapes and is higher than a second range of oxygen concentration used to form bumps having globular shapes.

The first range of oxygen concentration may be between about 200 parts per million (ppm) and about 500 ppm.

The second range of oxygen concentration may be between about 5 ppm and about 50 ppm.

The third range of oxygen concentration may be greater than about 50 ppm and less than about 200 ppm.

The forming may include disposing, on the semiconductor chip, a mask including a hole pattern having the same shape as the electrode pad, screen-printing of a solder paste in the hole pattern, and separating the mask from the semiconductor chip.

The semiconductor device may correspond to one of a semiconductor diode device, a semiconductor transistor device, and a semiconductor light emitting device.

In another embodiment, a method of manufacturing a semiconductor device is disclosed. The method comprises: providing a semiconductor substrate including at least a first electrode pad disposed thereon; forming a conductive bump on the first electrode pad; selecting between a globular reflow process and planar reflow process; and based on the selection, performing either a globular reflow process using a first oxygen concentration, or a planar reflow process using a second oxygen concentration, to control the shape of the conductive bump.

In one embodiment, the first oxygen concentration is within a first range of oxygen concentrations and the second oxygen concentration is within a second range of oxygen concentrations, the oxygen concentrations within the first range being smaller than the oxygen concentrations within the second range.

The first range may be between about 5 parts per million (ppm) and about 50 ppm oxygen concentration, and the second range may be between about 200 ppm and 500 ppm oxygen concentration. The second oxygen concentration may be at least 10 times the first oxygen concentration.

In one embodiment, the electrode pad comprises: a first electrode layer formed of a first metal and formed on the semiconductor device; and a second electrode layer formed of a second metal including at least one of gold (Au), silver (Ag), platinum (Pt), and palladium (Pd), and formed on the first electrode layer.

In one embodiment, the method, further comprises controlling a degree of absorption by which the second electrode layer is absorbed in the bump, by adjusting the oxygen concentration.

When a globular reflow process is used, the conductive bump may occupy between about 50% and 60% of the area of the first electrode pad, and when a planar reflow process is used, the conductive bump may occupy between about 95% and about 100% of the area of the first electrode pad.

In a further embodiment, a method of manufacturing a bump includes: forming a bump on an electrode pad of a semiconductor device; selecting one process from at least two of: a globular reflow process, a semi-globular reflow process, and planar reflow process; and using the selected process, controlling a shape of the bump by reflowing the bump formed on the semiconductor chip under an oxygen atmosphere.

In one embodiment, the selected process uses oxygen concentration selected from one of the following ranges: 5 parts per million (ppm) to 50 ppm; 50 ppm to 200 ppm; and 200 ppm to 500 ppm.

BRIEF DESCRIPTION OF THE DRAWINGS

These and/or other aspects, features, and advantages of the disclosure will become apparent and more readily appreciated from the following description of embodiments, taken in conjunction with the accompanying drawings of which.

DETAILED DESCRIPTION

Reference will now be made in detail to embodiments of the present disclosure, examples of which are illustrated in the accompanying drawings, wherein like reference numerals refer to the like elements throughout. The invention may, however, be embodied in many different forms and should not be construed as limited to the embodiments set forth herein. In the drawings, the size and relative sizes of layers and regions may be exaggerated for clarity.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIGS. 2 through 7 illustrate a method of forming a bump according to certain exemplary embodiments.

Figure 2:
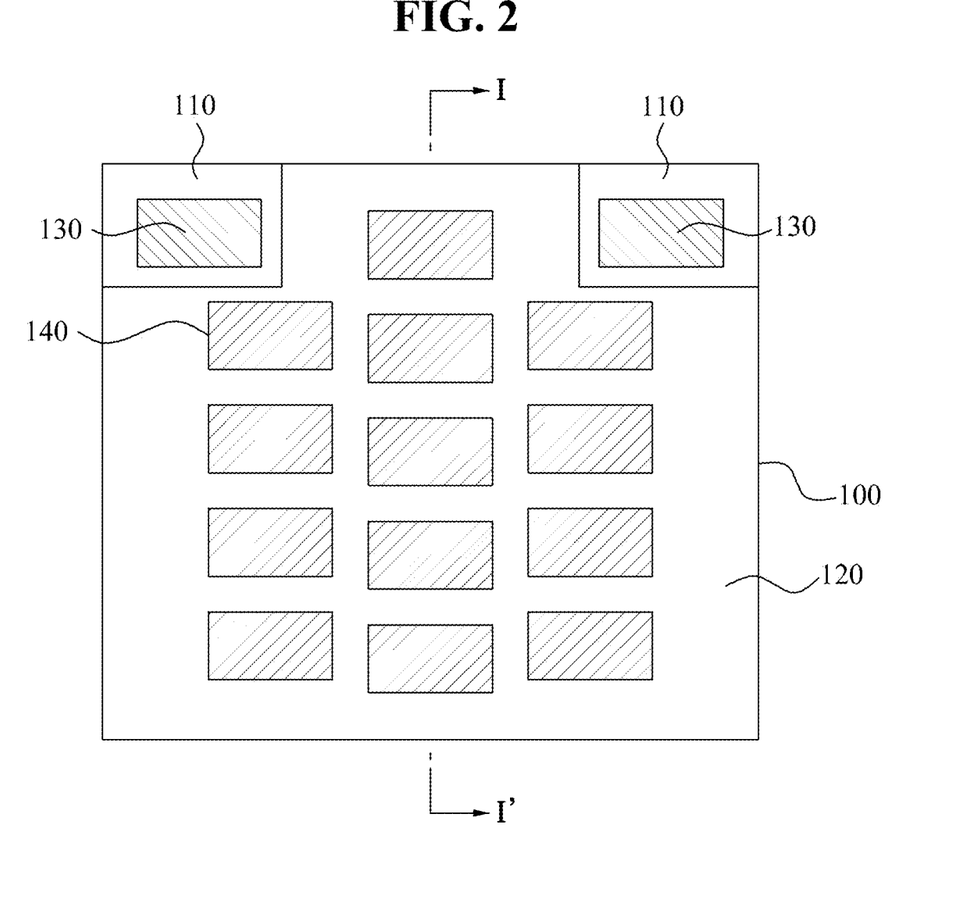
FIGS. 2 through 7 are diagrams illustrating a method of forming a bump according to an exemplary embodiment.

FIG. 2 is a planar view of one side of a semiconductor device 100 including a plurality of electrode pads 130 and 140. Referring to FIG. 2, the semiconductor device 100 may be one of varied types of devices. For example, the semiconductor device 100 may be one of a semiconductor diode device, a semiconductor transistor device, and a semiconductor light emitting device, or may be a different type of semiconductor device. Throughout the specification, it is assumed that the semiconductor device 100 is a semiconductor light emitting device.

Referring to FIG. 2, the semiconductor device 100 may include a first semiconductor layer 110 of which a portion is exposed due to a stacked structure (e.g., mesa structure, step structure, etc.), and a second semiconductor layer 120 disposed on the first semiconductor layer 110. For example, each of the first layer and second layer may include a substrate that is part of a semiconductor chip, and may include various circuit elements. Although not illustrated, the semiconductor device 100 may further include an activation layer between the first semiconductor layer 110 and the second semiconductor layer 120, and light is emitted by the activation layer.

The semiconductor device 100 may include a plurality of first electrodes and a plurality of second electrodes. The electrodes may be in the form of electrode pads (e.g., 130 and 140) connected to internal circuitry of the semiconductor device 100. The first electrode pad 130 may be disposed on a portion of the first semiconductor layer 110, and the second electrode pad 140 may be disposed on the second semiconductor layer 120.

A number of the first electrode pads 130 and the second electrode pads 140, and an alignment of the first electrode pads 130 and the second electrode pads 140 are not limited to the number and the alignment described with reference to FIG. 2, and may vary based on a type of device or a structure.

Figure 3:
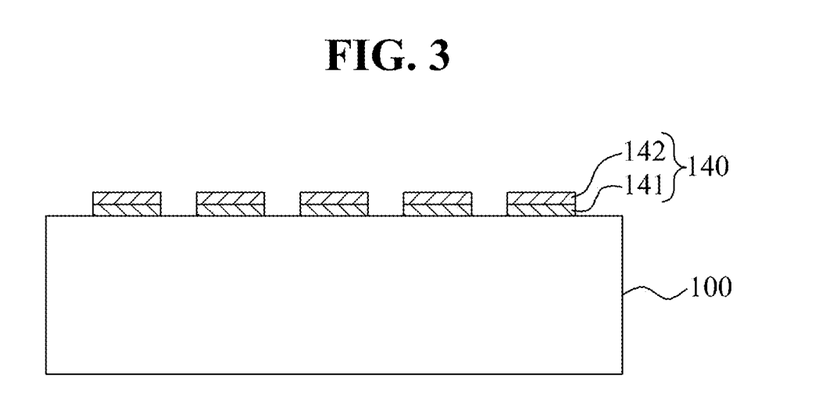

FIG. 3 is an exemplary cross-sectional view of the semiconductor device 100 cut along a line I-I'. Referring to FIG. 3, the plurality of second electrode pads 140 is disposed on the semiconductor device 100. Each second electrode pad 140 may include a first electrode layer 141 and a second electrode layer 142.

The first electrode layer 141 may be formed on the semiconductor device 100, and may be formed of a first metal, such as chromium (Cr), for example. The second electrode layer 142 may be formed on the first electrode layer 1141, and may be formed, for example, of at least one of gold (Au), silver (Ag), platinum (Pt), and palladium (Pd).

The second electrode pad 140 may include only the first electrode layer 141 and the second electrode layer 142, and may also have a structure including a different metallic layer, the first electrode layer 141, and the second electrode layer 142. When the second electrode pad 140 has the structure including the different metallic layer, the first electrode layer 141 and the second electrode layer 142 may be disposed above the additional, different metallic layer of the second electrode pad 140.

Although not illustrated, the first electrode pad 130 may also include a first electrode layer and a second electrode layer.

Figure 4:
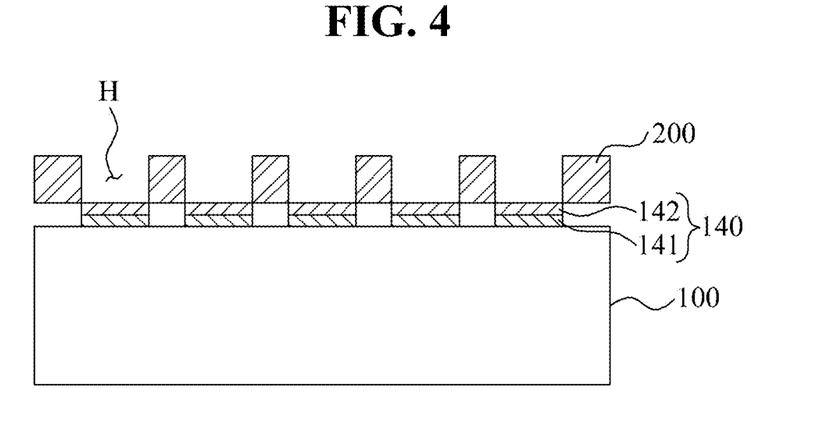

FIG. 4 illustrates an exemplary process that disposes a mask 200 on the semiconductor device 100.

The mask 200 may include, for example, a hole pattern H including holes having the same shape when viewed from above as the second electrode pad 140, at a location, corresponding to the second electrode pad 140, on the semiconductor device 100. Accordingly, the second electrode pad 140 may be exposed through the hole pattern H included in the mask 200.

Although FIG. 4 illustrates a state of the mask 200 being disposed on the second electrode pad 140, the mask 200 may also be disposed on the first electrode pad 130 so that the first electrode pad 130 may be exposed through a hole pattern H.

Figure 5:
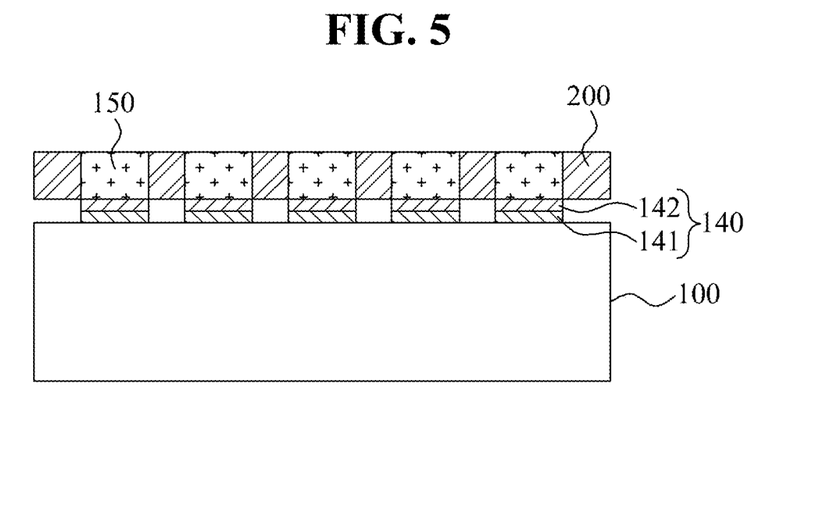

FIG. 5 illustrates an exemplary process that performs screen-printing of a solder paste for forming a bump in a hole pattern H included in the mask 200. The hole pattern H may be filled with the solder paste, for example, by pressing the solder paste with a squeegee in one direction, while the mask 200 is disposed on the semiconductor device 100 as shown in FIG. 3. The screen-printing process may be repeatedly performed by divisionally applying the solder paste. Through the screen-printing of the solder paste, a plurality of solder bumps including, for example, a solder bump 150, hereinafter referred to as a bump 150, may be formed as illustrated in FIG. 5.

The bump 150 may have a high degree of adhesion to at least one of Au, Ag, Pt, and Pd used for forming the second electrode layer 142 of the second electrode pad 140, and may have a low degree of adhesion to Cr used for forming the first electrode layer 141 of the second electrode pad 140. The bump 150 may be formed, for example of a solder material including materials such as tin (Sn), copper (Cu), silver (Ag), other metals, and/or flux.

Figure 6:
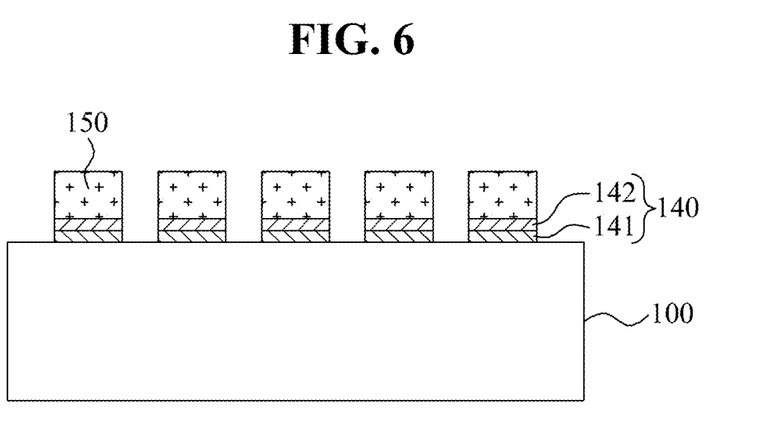

FIG. 6 illustrates an exemplary state of the mask 200 being separated from the semiconductor device 100. The mask 200 may be separated from the semiconductor device 100 after the bump 150 is formed, for example, through a screen-printing process as shown in FIG. 5.

As shown in FIG. 6, when the bump 150 is formed on the second electrode pad 140 included in the semiconductor device 100, the bump 150 and other bumps formed may be reflowed. Through the reflow, the bump 150 may melt and thus, a shape of the bump 150 may be controlled.

It is desirable that the shape of the bump 150 be changed based on a product to which the semiconductor device 100 is to be applied. Particularly, when the semiconductor device 100 is applied to a large-scaled product, for example a central processing unit (CPU), a graphics processing unit (GPU), a chipset, and the like, it is desirable that the bump 150 has a large area so as to increase a heat radiation. As such, a bottom surface of the bump 150 may be configured to have a size and planar shape similar to that of the second electrode pad 140 so that heat generated in the semiconductor device 100 may be promptly radiated to an external side through the bump 150.

Conversely, when the semiconductor device 100 is applied to a portable device, it is desirable that the bump 150 has a high degree of adhesion to a substrate (not illustrated) so as to minimize an effect from a vibration. For example, the bump 150 may be formed in a globular shape to improve a degree of adhesion between the semiconductor device 100 and the substrate. As such, the bottom surface of the bump 150 may be configured to have a size smaller than the second electrode pad 140. As described in the foregoing, the shape of the bump 150 may be changed based on a product to which the semiconductor device 100 is to be applied. The shape of the bump 150 may be controlled by reflowing the bump 150 formed on the semiconductor device 100, under an oxygen atmosphere.

When the semiconductor device 100, on which the bump 150 is formed, is installed at an entrance of a reflow chamber, the semiconductor device 100 may be moved in one direction through a moving tool. In this example, the bump 150 may be reflowed by a thermal energy generated from an inside of the reflow chamber. Through the thermal energy, an interface reaction occurs between the bump 150 and the second electrode layer 142 of the second electrode pad 140, so that the second electrode layer 142 may be absorbed in the bump 150.

During the reflow process, a range of oxygen concentration may be adjusted so as to control a degree of absorption by which the second electrode layer 142 is absorbed in the bump 150 and thus, the shape of the bump 150 may be controlled. In one embodiment, the degree of the absorption may include an amount of the absorption and a speed of the absorption by which the second electrode layer 142 is absorbed.

A control device associated with the machine in which the reflow chamber is situated may be used to adjust the amount of oxygen concentration used during the reflow process. As such, one of a globular reflow process, a planar reflow process, and a semi-globular reflow process can be selected by controlling the amount or range of oxygen concentration used during the reflow process. For example, an amount of oxygen concentration may be selected so that the oxygen concentration is regulated to be that amount or approximately that amount. As another example, a range of oxygen concentration may be set so that the concentration remains within that range during the reflow process.

Figure 7:
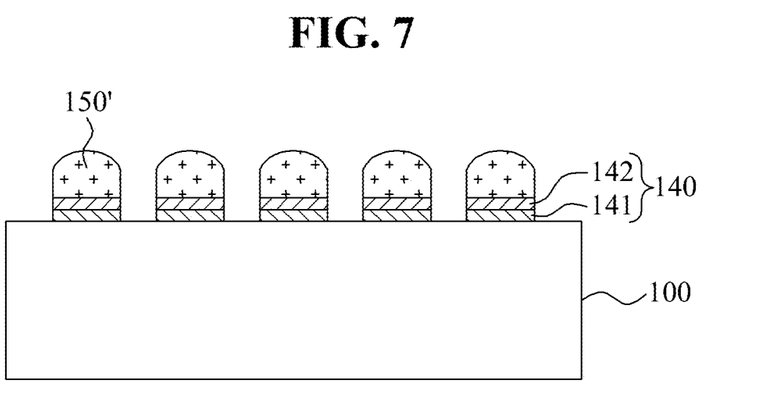
Figure 8:
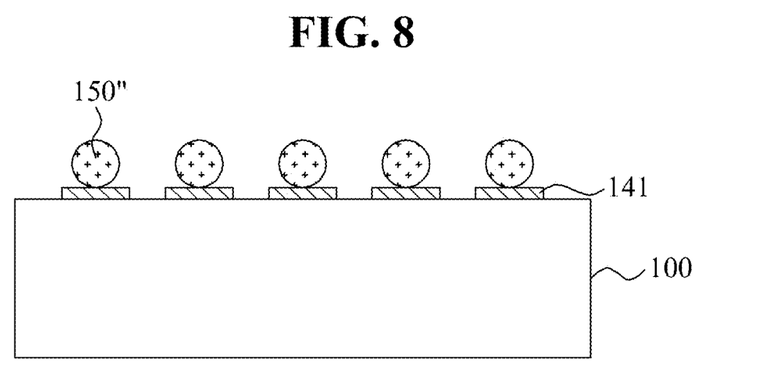
FIG. 8 is a diagram illustrating a method of forming a bump according to another exemplary embodiment.

FIGS. 7 and 8 illustrate an exemplary process that manufactures different shapes of bumps by changing a range of oxygen concentration during a reflow process.

FIG. 7 illustrates an exemplary bump 150' reflowed under an oxygen atmosphere having a first range of oxygen concentration. When the reflow is performed under the oxygen atmosphere having the first range of oxygen concentration, the bump 150' may have a bottom surface having a size and planar shape similar to that of the second electrode pad 140. A top surface of the bump 150' may be rounded. In one embodiment, the top surface has a radius of curvature that is larger than the height of the bump. In one embodiment, when the reflow is performed under the first range of oxygen concentration, the resulting bump 150' may have contact angles with respect to a surface of the semiconductor device that are greater than 90°. In one embodiment, the first range of oxygen concentration is between about 200 parts per million (ppm) and about 500 ppm. When the reflow is performed at the first range of oxygen concentration, an interface reaction between the bump 150' and the second electrode layer 142 may be repressed due to a high oxygen concentration. Accordingly, the second electrode layer 142 may not be absorbed in the bump 150' and may remain on the first electrode layer 141, even when the reflow process is completed.

As described above, a metal used for forming the second electrode layer 142, for example, Au, Ag, Pt, Pd, and the like, may have a high degree of adhesion to the bump 150'. Also, during the reflow process, a surface energy of the bump 150' may be increased due to the oxygen atmosphere having the first range of oxygen concentration. Accordingly, the bump 150' may be formed on the whole area of the second electrode pad 140, may have the same square-planar shape as the second electrode pad 140 when viewed from above, may have a surface of which a curvature is low (e.g. radius of curvature is larger than the height, and may be, e.g., 2-10 times the height), may have a large contact angle (e.g., less than 90°, such as between 110° and 150°), and may have a first height.

FIG. 8 illustrates an exemplary bump 150" reflowed under an oxygen atmosphere having a second range of oxygen concentration. When the reflow is performed under the oxygen atmosphere having the second oxygen concentration, the bump 150" may be formed in a globular shape, irrespective of a shape of the second electrode pad 140. A top surface of the bump 150" may be rounded and may have a radius of curvature that is smaller than the height of the bump. In one embodiment, when the reflow is performed under the second range of oxygen concentration, the resulting bump 150" may have contact angles with respect to a surface of the semiconductor device that are less than 90°. The second range of oxygen concentration may be lower than the first range of oxygen concentration, and may be between about 5 ppm and about 50 ppm. When the reflow is performed at the second range of oxygen concentration, an interface reaction between the bump 150" and the second electrode layer 142 may not be repressed due to a low oxygen concentration. Accordingly, the second electrode layer 142 may be significantly absorbed in the bump 150", and the second electrode layer 142 may not remain when the reflow is completed and thus, the bump 150" is substantially formed on the second electrode layer 141.

Cr used for forming the first electrode layer 141 may be a metal having a low reactivity with the bump 150" and thus, may have a low adhesion to the bump 150". Also, during the reflow process, a surface energy of the bump 150" may be decreased due to the oxygen atmosphere having the second range of oxygen concentration. Accordingly, the bump 150" may not be spread over the whole area of the first electrode layer 141 when viewed from above, and may adhere to a portion of the area and may be formed in a globular shape. Also, the bump 150" formed in the globular shape may have a second height that is higher than the first height of the bump 150' of FIG. 7. The globular shape may be a complete sphere, or may have a flat bottom surface and may have a partial sphere shape. In certain embodiments, the globular shape has a contact angle with respect to the first electrode layer 141 that is less than 90°. For example, in certain embodiments, the contact angle may be between 30° and 70°. In addition, the globular shape may have a radius of curvature that is smaller than the height of the bump 150". In certain embodiments, the radius of curvature of the bump 150" is between 0.5 and 1 times the height of the bump 150".

Although the same oxygen concentration is used, a degree of absorption by which the second metallic layer 142 is absorbed may vary based on an amount of the bump 150, that is, an amount of solder paste, and a size of the second metallic layer 142. Accordingly, within the second range of oxygen concentration, an appropriate oxygen concentration may be determined based on the amount of the bump 150, such as the amount of solder paste, and the size of the second metallic layer 142, for reflowing.

The bumps 150' and 150" of FIGS. 7 and 8 may be formed on the second electrode pads 140 having the same shape and size, but the shapes of the bumps 150' and 150" may be changed by adjusting oxygen concentration during the reflow process.

According to another exemplary embodiment, when the bump 150 of FIG. 6 is reflowed under an oxygen atmosphere having a third range of oxygen concentration, a bump may be formed in a substantially semi-globular shape. Also, a bump of which a ratio of an area occupied by the bump to the whole area of the second electrode pad 140 is lower than the bump 150' of FIG. 7, and a ratio of an area occupied by the bump to the whole area of the second electrode pad 140 is higher than the bump 150" of FIG. 8, may be formed. In this example, a radius of curvature of the bump may be approximately the same as the height of the bump, and the contact angle of the bump with respect to a surface of the semiconductor device 100 may be approximately 90°. In this example, the third range of oxygen concentration may be greater than 50 ppm and less than 200 ppm.

Figure 9:
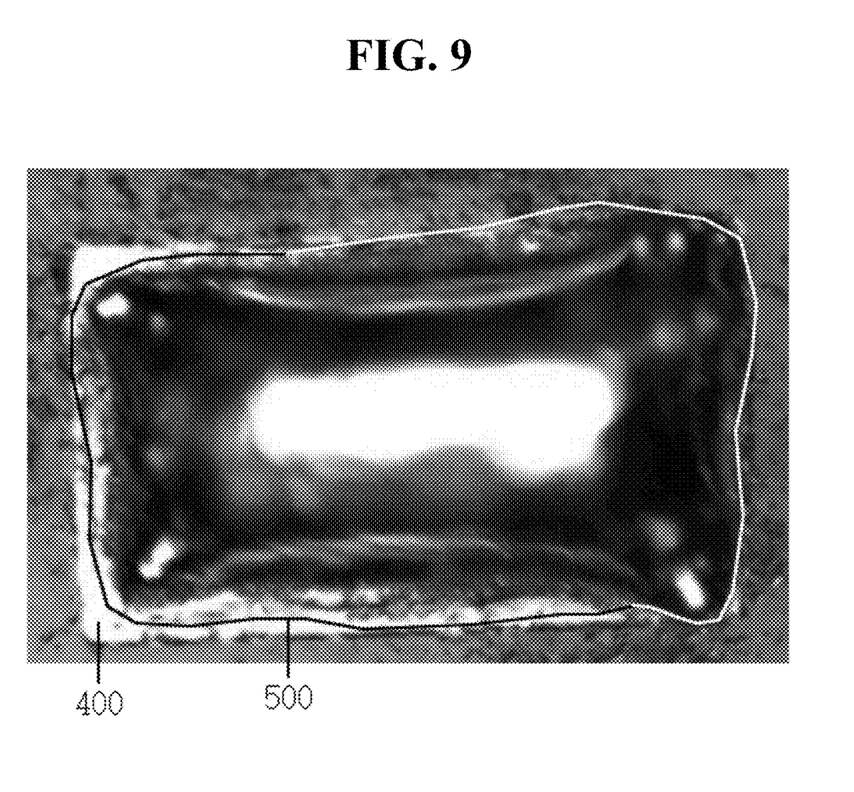
FIGS. 9 through 11 are diagrams illustrating photos of bumps formed based on various exemplary embodiments.
Figure 10:
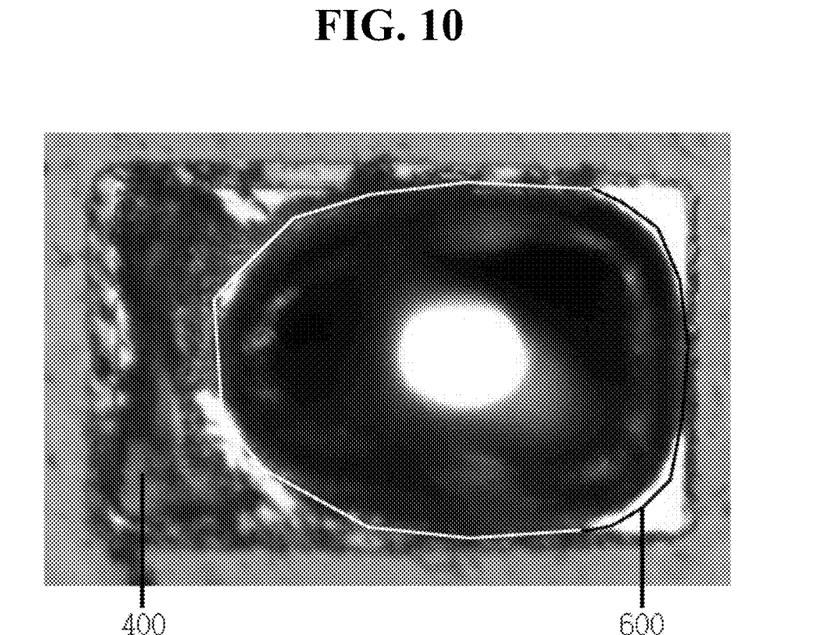
Figure 11:
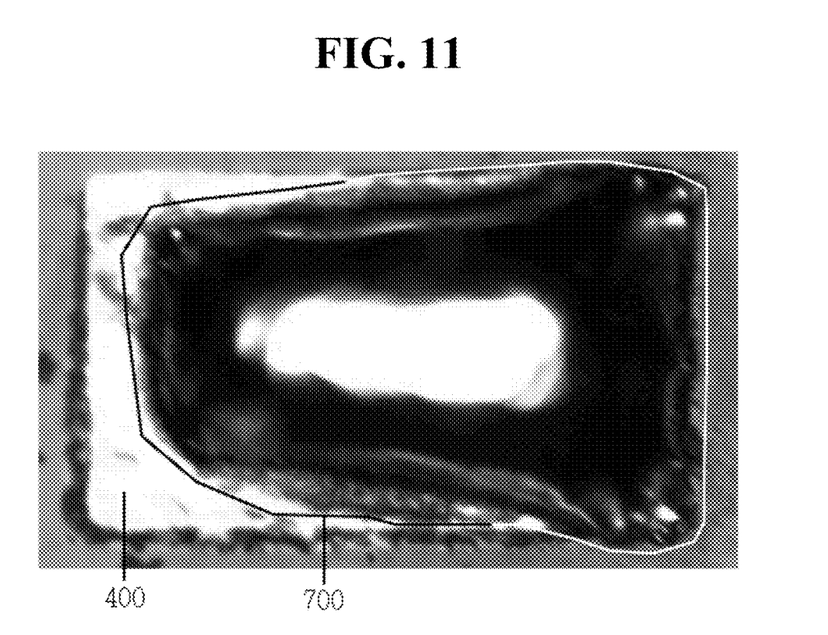

FIGS. 9 through 11 illustrate photos of bumps 500, 600, and 700 formed based on various embodiments of the present invention. The bumps 500, 600, and 700 may be obtained through reflowing under oxygen atmospheres having different oxygen concentrations while the same amount of the same solder paste is applied on the same electrode pad 400.

The bump 500 of FIG. 9 may be obtained through reflowing under an oxygen atmosphere having a first range of oxygen concentration, for example, a range between about 200 ppm and about 500 ppm. The bump 500 may have a high adhesion to the electrode pad 400, and a surface energy of the bump 500 is increased and thus, the bump 500 may be formed on the whole area of the electrode pad 400. Accordingly, an area occupied by the bump 500 on the electrode pad 400 may be about 95%-100% of the electrode pad 400. Also, the solder paste is spread over 95% of the electrode pad 400 during the reflow process and thus, the bump 500 may have a first height that is less than or equal to 40 μm.

The bump 600 of FIG. 10 may be obtained through reflowing under an oxygen atmosphere having a second range of oxygen concentration, that is, a range between about 5 ppm and about 50 ppm. The bump 600 may have a low adhesion to the electrode pad 400, and a surface energy of the bump 600 is decreased and thus, the bump 600 may be formed in a globular shape. Accordingly, an area occupied by the bump 600 on the electrode pad 400 is about 50% through 60% of the electrode pad 400. Accordingly, the bump 600 may have a second height higher than the first height of the bump 500 of FIG. 9. The second height may be, for example, from a range between 50 μm and 85 μm.

The bump 700 of FIG. 11 may be obtained through reflowing under an oxygen atmosphere having a third range of oxygen concentration, for example, a range between about 50 ppm and about 200 ppm. An area occupied by the bump 700 on the electrode pad 400 may be about 70% through 80% of the electrode pad 400. As such, the solder paste may be spread over the electrode pad 400, for example, more than about 75% of the electrode pad 400 during the reflow process. Accordingly, the bump 700 has a third height that is higher than the first height of the bump 500 of FIG. 9 and is lower than the second height of the bump 600 of FIG. 10. The third height may be in a range, for example, between 41 μm and 45 μm.

Figure 12A:
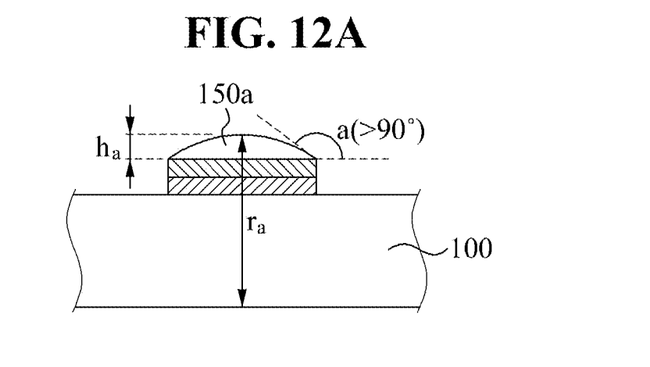
FIGS. 12A-12C are diagrams illustrating exemplary bumps formed according to various disclosed embodiments.
Figure 12B:
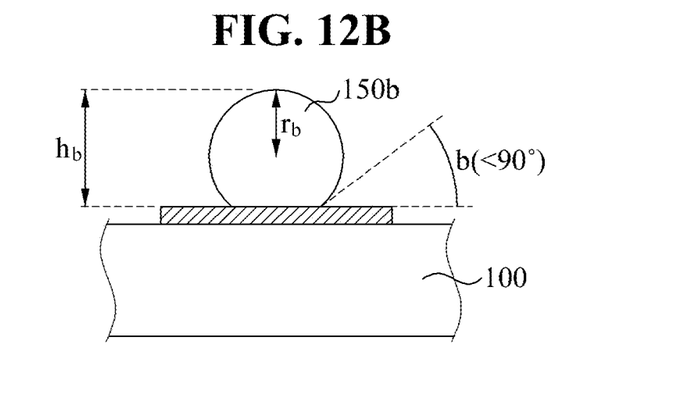
Figure 12C:
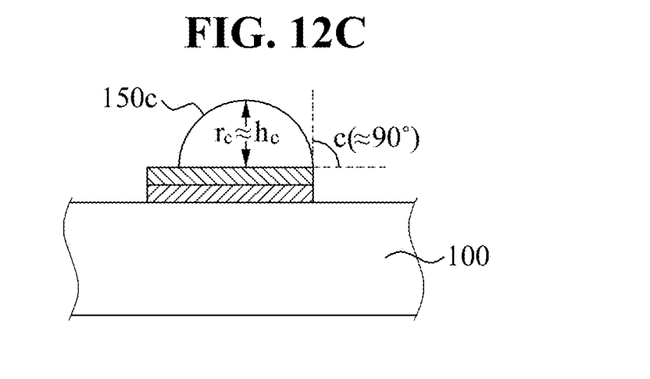

As shown in FIGS. 12a-12c, exemplary heights and contact angles are shown for exemplary planar, globular, and semi-globular bumps. For example, FIG. 12a shows a planar bump 150a, having a radius of curvature ra greater than the height ha of the bump, and a contact angle a greater than 90°. FIG. 12b shows a globular bump 150b, having a radius of curvature rb less than the height hb of the bump, and a contact angle a less than 90°. FIG. 12c shows a semi-globular bump 150c, having a radius of curvature rc about the same as the height hc of the bump, and a contact angle of about 90°.

As illustrated in FIGS. 9 through 12, although the same amount of the same solder paste is applied on the same electrode pad 400, varied shapes of bumps 500, 600, and 700 may be formed by changing a range of oxygen concentration during the reflow process. Accordingly, a shape of a bump may be appropriately formed based on a product to which the semiconductor device 100 is to be applied, so that flip chip bonding may be readily performed.

According to the exemplary embodiments, the bump manufacturing method may change a shape of a bump by adjusting a range of oxygen concentration during a reflow process, without changing a shape of an electrode pad. Accordingly, the shape of the bump may be changed without a separate tool or equipment being utilized and thus, manufacturing costs may be reduced.

Although a few embodiments have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A method of manufacturing a bump, the method comprising:
    forming a bump on an electrode pad included on a semiconductor chip; and
    controlling a shape of the bump by:
        adjusting an amount of oxygen concentration in a reflow chamber to select between a first concentration within a first range of oxygen concentration and a second concentration within a second range of oxygen concentration lower than the first range of oxygen concentration, the second concentration being lower than the first concentration; and
        reflowing the bump formed on the semiconductor chip under an oxygen atmosphere having the selected oxygen concentration, and
        controlling the shape of the bump to have one of a globular shape or a planar shape based on the selected oxygen concentration.

2. The method of claim 1, wherein the electrode pad comprises:
    a first electrode layer formed of chromium (Cr) and formed on the semiconductor chip; and
    a second electrode layer formed of at least one of gold (Au), silver (Ag), platinum (Pt), and palladium (Pd), and formed on the first electrode layer.

3. The method of claim 1, wherein the bump corresponds to a solder bump.

4. The method of claim 1, wherein the controlling comprises:
    controlling a degree of absorption by which a metallic layer of the electrode pad is absorbed in the bump, by adjusting the amount of oxygen concentration.

5. The method of claim 1, wherein the controlling comprises:
    controlling the shape of the bump to be one of the planar shape by reflowing the bump under the first range of oxygen concentration, or the globular shape by reflowing the bump under the second range of oxygen concentration which is lower than the first range of oxygen concentration.

6. The method of claim 5, wherein the first range of oxygen concentration is between about 200 parts per million (ppm) and about 500 ppm.

7. The method of claim 5, wherein the second range of oxygen concentration is between about 5 ppm and about 50 ppm.

8. The method of claim 5, wherein the controlling comprises:
    controlling the shape of the bump to have a semi-globular shape on the electrode pad, by reflowing the bump under a third range of oxygen concentration, which is lower than the first range of oxygen concentration used to form bumps having planar shapes and is higher than the second range of oxygen concentration used to form bumps having globular shapes.

9. The method of claim 8, wherein the third range of oxygen concentration is greater than about 50 ppm and less than about 200 ppm.

10. The method of claim 1, wherein the forming comprises:
disposing, on the semiconductor chip, a mask including a hole pattern that includes a hole having the same shape as the electrode pad;
screen-printing of a solder paste in the hole pattern; and
separating the mask from the semiconductor chip.

11. The method of claim 1, wherein the semiconductor chip corresponds to one of a semiconductor diode device, a semiconductor transistor device, and a semiconductor light emitting device.

12. A method of manufacturing a semiconductor device, the method comprising:
providing a semiconductor substrate including at least a first electrode pad disposed thereon;
forming a conductive bump on the first electrode pad;
selecting between a globular reflow process and planar reflow process; and
based on the selection, performing either a globular reflow process that results in the conductive bump having a globular shape by using a first oxygen concentration, or a planar reflow process that results in the conductive bump having a planar shape by using a second oxygen concentration different from the first oxygen concentration, to control the shape of the conductive bump.

13. The method of claim 12, wherein the first oxygen concentration is within a first range of oxygen concentrations and the second oxygen concentration is within a second range of oxygen concentrations, the oxygen concentrations within the first range being smaller than the oxygen concentrations within the second range.

14. The method of claim 13, wherein the first range is between about 5 parts per million (ppm) and about 50 ppm oxygen concentration, and the second range is between about 200 ppm and 500 ppm oxygen concentration.

15. The method of claim 12, wherein the second oxygen concentration is at least 10 times the first oxygen concentration.

16. The method of claim 12, wherein the electrode pad comprises:
a first electrode layer formed of a first metal and formed on the semiconductor device; and
a second electrode layer formed of a second metal including at least one of gold (Au), silver (Ag), platinum (Pt), and palladium (Pd), and formed on the first electrode layer.

17. The method of claim 16, further comprising:
controlling an amount of the second electrode layer that is absorbed in the bump, by adjusting the oxygen concentration.

18. The method of claim 12, wherein:
when a globular reflow process is used, the conductive bump occupies between about 50% and 60% of the area of the first electrode pad; and
when a planar reflow process is used, the conductive bump occupies between about 95% and about 100% of the area of the first electrode pad.

19. A method of manufacturing a bump, the method comprising:
forming a bump on an electrode pad of a semiconductor device;
selecting one process from at least two of: a globular reflow process, a semi-globular reflow process, and planar reflow process;
when a globular reflow process is selected, setting a first amount of oxygen concentration in a reflow chamber to be within a first range of oxygen concentrations, and performing a reflow on the bump using the set first amount of oxygen concentration, resulting in the bump having a globular shape occupying a first amount of area of the electrode pad;
when a semi-globular reflow process is selected, setting a second amount of oxygen concentration in a reflow chamber to be within a second range of oxygen concentrations, and performing a reflow on the bump using the set second amount of oxygen concentration, restating in the bump having a semi-globular shape occupying a second amount of area of the electrode pad; and
when a planar reflow process is selected, setting a third amount of oxygen concentration in a reflow chamber to be within a third range of oxygen concentrations, and performing a reflow on the bump using the set third amount of oxygen concentration, resulting in the bump having a planar shape occupying a third amount of area of the electrode pad,
wherein the set second amount of oxygen concentration is between the set first amount of oxygen concentration and the set third amount of oxygen concentration, and
wherein the third amount of area is greater than the second amount of area, which is greater than the first amount of area.

20. The method of claim 19, wherein the selected process uses oxygen concentration selected from one of the following ranges: 5 parts per million (ppm) to 50 ppm; 50 ppm to 200 ppm; and 200 ppm to 500 ppm.

* * * * *